US012604612B2

(12) United States Patent
Hong et al.

(10) Patent No.: US 12,604,612 B2
(45) Date of Patent: Apr. 14, 2026

(54) DISPLAY DEVICE INCLUDING PAD STRUCTURE FOR ENHANCED RELIABILITY

(71) Applicant: LG Display Co., Ltd., Seoul (KR)

(72) Inventors: HyunSeok Hong, Gumi-si (KR); Boeun Jo, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 902 days.

(21) Appl. No.: 17/896,862

(22) Filed: Aug. 26, 2022

(65) Prior Publication Data

US 2023/0111421 A1 Apr. 13, 2023

(30) Foreign Application Priority Data

Oct. 7, 2021 (KR) ........................ 10-2021-0133460

(51) Int. Cl.
*H10K 59/121* (2023.01)
*H10K 50/84* (2023.01)
*H10K 59/131* (2023.01)
*H10K 59/40* (2023.01)

(52) U.S. Cl.
CPC ......... *H10K 59/1213* (2023.02); *H10K 50/84* (2023.02); *H10K 59/131* (2023.02); *H10K 59/40* (2023.02)

(58) Field of Classification Search
CPC .. H10K 59/1213; H10K 59/131; H10K 59/40; H10K 50/84

USPC .......................................................... 257/40
See application file for complete search history.

(56) References Cited

U.S. PATENT DOCUMENTS

2004/0126916 A1 7/2004 Song et al.
2015/0091014 A1 4/2015 Hong
2021/0257577 A1* 8/2021 Bang ................... H10K 59/131

FOREIGN PATENT DOCUMENTS

CN 104516165 A 4/2015
CN 107887408 A 4/2018
CN 109887952 A 6/2019
KR 10-2016-0033571 A 3/2016
KR 10-2019-0003181 A 1/2019
KR 10-2019-0009147 A 1/2019
KR 10-2019-0066748 A 6/2019
KR 10-2019-0073919 A 6/2019

* cited by examiner

*Primary Examiner* — Xia L Cross
(74) *Attorney, Agent, or Firm* — Birch, Stewart, Kolasch & Birch, LLP

(57) ABSTRACT

A display device can include a substrate including an active area in which a plurality of pixels are disposed, and a non-active area extending from the active area and including a pad area; a plurality of pads disposed in the pad area; a plurality of link lines disposed in the non-active area and connected to the plurality of pads; and a driver integrated circuit (IC) bonded to the plurality of pads. The display device can further include a passivation layer disposed on portions of the plurality of pads disposed in the pad area, in which outer edges of each of the plurality of pads are covered by the passivation layer.

18 Claims, 10 Drawing Sheets

DISPLAY DEVICE INCLUDING PAD STRUCTURE FOR ENHANCED RELIABILITY

CROSS-REFERENCE TO RELATED APPLICATIONS

This application claims priority to Korean Patent Application No. 10-2021-0133460 filed on Oct. 7, 2021 in the Republic of Korea, the entirety of which is hereby expressly incorporated by reference into the present application.

BACKGROUND

Technical Field

The present disclosure relates to a display device, and more particularly, to a display device capable of minimizing an interface delamination phenomenon and a dark spot defect phenomenon in a pad area of the display device.

Discussion of the Related Art

Display devices used for a computer monitor, a TV, a mobile phone, and the like include an organic light emitting display (OLED) that emits light by itself, a liquid crystal display (LCD) that requires a separate light source, and the like.

Display devices are being applied to more and more various fields including not only a computer monitor and a TV, but also personal mobile devices, and thus, display devices having a reduced volume and weight while having a wide active area are being studied.

Recently, a flexible display device that is manufactured to display an image even if it is bent like paper by forming a display element, lines, and the like on a flexible substrate, such as plastic, which is a flexible material has received considerable attention as a next-generation display device.

However, small flexible display devices with narrow bezels can have issues with peeling between various elements and layers, and decreased lifespan or impaired image quality may occur. For instance, some pads or other elements in a pad area location in a non-active area of the display device may experience peeling and become disconnected from a corresponding link line, or some pads may be exposed to undesirable chemicals during the manufacturing process of the device, since in a small device, the pads may be located a small distance away from the active area of the display. Thus, this makes it hard to protect or isolate certain areas of the device from other areas of the device during different manufacturing steps, which many lead to contamination or impairment of components.

SUMMARY OF THE DISCLOSURE

An aspect of the present disclosure is to provide a display device capable of minimizing an interface delamination phenomenon due to a planarization layer disposed in a pad area.

Another aspect of the present disclosure is to provide a display device in which a dark spot defect phenomenon due to a residue generated by exposing a pad pattern during a manufacturing process of the display device is minimized.

Objects of the present disclosure are not limited to the above-mentioned objects, and other objects, which are not mentioned above, can be clearly understood by those skilled in the art from the following descriptions.

A display device according to an example embodiment of the present disclosure includes a substrate including an active area in which a plurality of pixels are disposed, and a non-active area extending from the active area and including a pad area; a plurality of transistors disposed in the plurality of pixels on the substrate; a passivation layer disposed to cover the plurality of transistors; a plurality of pads disposed in the pad area; a plurality of link lines disposed in the non-active area and connected to the plurality of pads; and a driver IC bonded to the plurality of pads, in which the plurality of pads can include first pad patterns formed of the same material as source electrodes and drain electrodes of the plurality of transistors, in which the passivation layer can be disposed to cover ends of the first pad patterns.

A display device according to another example embodiment of the present disclosure includes a substrate including an active area in which a plurality of pixels are disposed and a non-active area in which a pad area is disposed; a plurality of link lines disposed in the non-active area on the substrate; a plurality of pads including first pad patterns connected to the link lines and disposed in the pad area; a plurality of transistors disposed in each of the plurality of pixels on the substrate; a passivation layer disposed on the plurality of transistors and the first pad patterns; a light emitting element disposed on the passivation layer; and a driver IC bonded to the plurality of pads in a chip on plastic (COP) method in the pad area, in which the passivation layer has contact holes formed therein, the contact holes exposing portions of the first pad patterns.

Other detailed matters of the example embodiments are included in the detailed description and the drawings.

According to the present disclosure, by disposing a passivation layer formed of an inorganic material in a pad area to cover ends of pad patterns in the pad area, an interface delamination phenomenon can be minimized.

According to the present disclosure, a passivation layer is disposed on pad patterns, so that it is possible to protect and prevent the pad patterns from coming into contact with a material that may cause a residue during a manufacturing process of a display device.

The effects according to the present disclosure are not limited to the contents exemplified above, and more various effects are included in the present specification.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain principles of the disclosure. In the drawings.

DETAILED DESCRIPTION OF THE EMBODIMENTS

Figure 1:
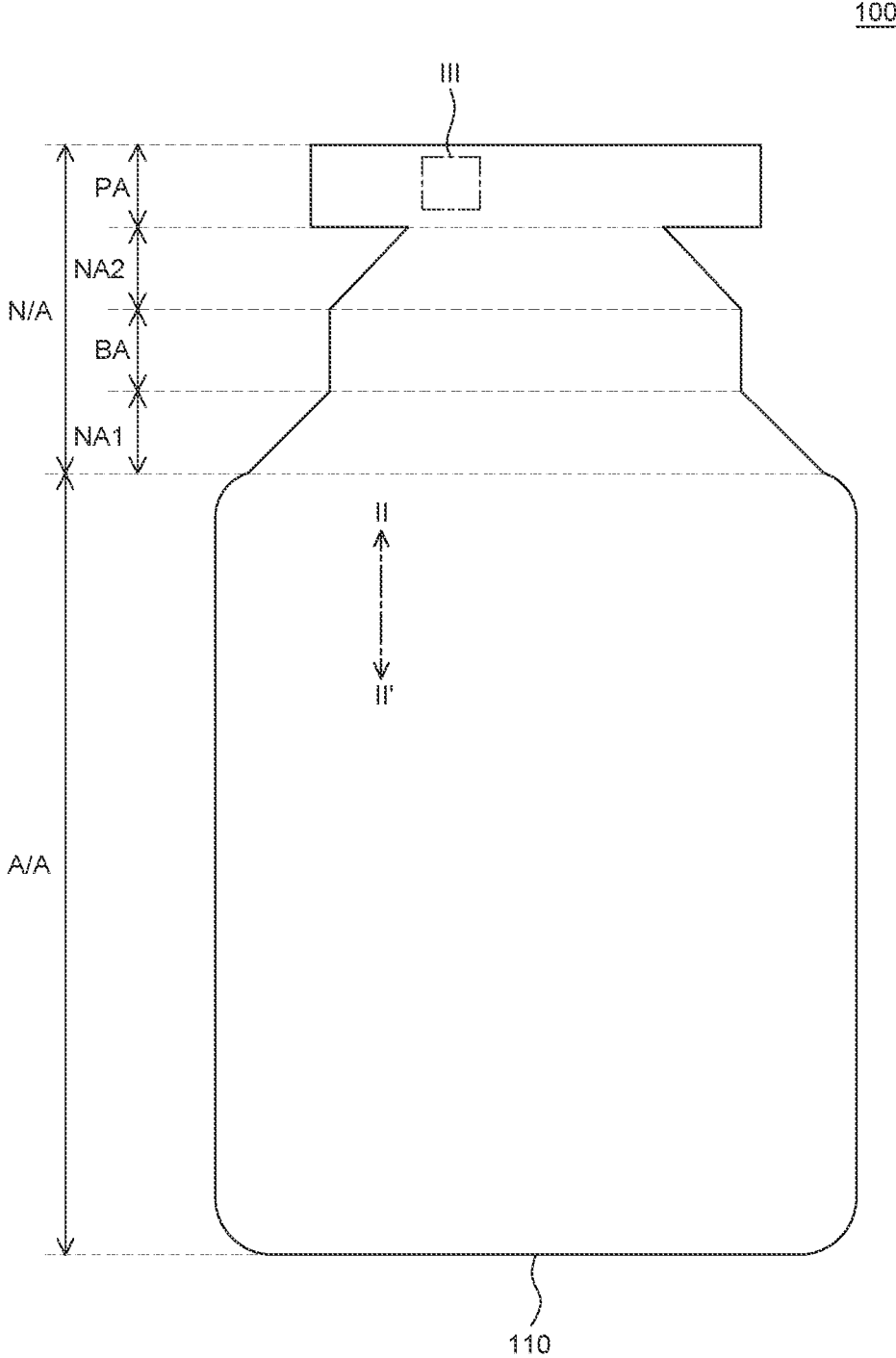
FIG. 1 is a plan view of a display device according to an example embodiment of the present disclosure.

Advantages and characteristics of the present disclosure and a method of achieving the advantages and characteristics will be clear by referring to example embodiments described below in detail together with the accompanying drawings. However, the present disclosure is not limited to the example embodiments disclosed herein but will be implemented in various forms. The example embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the example embodiments of the present disclosure are merely examples, and the present disclosure is not limited thereto. Like reference numerals generally denote like elements throughout the specification. Further, in the following description of the present disclosure, a detailed explanation of known related technologies can be omitted to avoid unnecessarily obscuring the subject matter of the present disclosure. The terms such as "including," "having," and "comprising" used herein are generally intended to allow other components to be added unless the terms are used with the term "only." Any references to singular can include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, it may be directly on the other element or layer, or another layer or another element may be interposed therebetween.

Although the terms "first," "second," and the like are used for describing various components, these components are not confined by these terms. These terms are merely used for distinguishing one component from the other components. Therefore, a first component to be mentioned below can be a second component in a technical concept of the present disclosure.

Same reference numerals generally denote same elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a stretchable display device according to example embodiments of the present disclosure will be described in detail with reference to accompanying drawings. All the components of each display device according to all embodiments of the present disclosure are operatively coupled and configured.

FIG. 1 is a plan view of a display device according to an example embodiment of the present disclosure. In FIG. 1, a substrate 110 is illustrated among various components of a display device 100 for convenience of explanation.

The substrate 110 is flexible (e.g., a flexible substrate), and is a substrate for supporting various components of the display device 100. The substrate 110 can be formed of a material having flexibility, for example, a plastic material such as polyimide (PI) or the like.

Referring to FIG. 1, the substrate 110 includes an active area A/A and a non-active area N/A.

The active area A/A is an area in which a plurality of pixels are disposed to display an image. A display unit for displaying an image and a circuit unit for driving the display unit can be formed in the active area A/A. For example, when the display device 100 is an organic light emitting display device, the display unit can include an organic light emitting element. That is, the display unit can include an anode, an organic layer on the anode, and a cathode on the organic layer. The organic layer can be configured to include, for example, a hole transport layer, a hole injection layer, an organic light emitting layer, an electron injection layer, and an electron transport layer. However, when the display device 100 is a liquid crystal display device, the display unit can be configured to include a liquid crystal layer. Hereinafter, descriptions are made assuming that the display device 100 is an organic light emitting display device for convenience of explanation, but the present disclosure is not limited thereto. The circuit unit can include various thin film transistors, capacitors, and lines for driving the organic light emitting element. For example, the circuit unit can include various components such as a driving thin film transistor, a switching thin film transistor, a storage capacitor, gate lines, data lines and the like, but is not limited thereto.

Referring to FIG. 1, the active area A/A can have a shape in which corners thereof are rounded. Recently, as design aspects are emphasized, there is a need for an active area A/A having a different shape other than an active area A/A having an existing rectangular shape. Accordingly, the substrate 110 of the display device 100 according to an example embodiment of the present disclosure has a shape in which corners thereof are rounded. However, the shape of the active area A/A is not limited thereto and the active area A/A can have other shapes, such as a rectangular shape and the like, according to embodiments.

The non-active area N/A is an area in which an image is not displayed, and is an area in which various lines and circuits such as link lines and the like for driving the display unit disposed in the active area A/A are disposed. In addition, various integrated circuits (ICs) and driving circuits, such as a gate driver IC and a data driver IC can be disposed in the non-active area N/A.

The non-active area N/A can be defined as an area extending from the active area A/A as illustrated in FIG. 1. However, the present disclosure is not limited thereto, and the non-active area N/A can be defined to include an area surrounding the active area A/A. Also, the non-active area N/A can be defined as extending from a plurality of sides of the active area A/A.

Referring to FIG. 1, the non-active area N/A includes a first non-active area NA1, a bending area BA, a second non-active area NA2, and a pad area PA. The first non-active area NA1 is an area extending from the active area A/A, and the bending area BA is an area extending from the first non-active area NA1 and is bendable. The second non-active area NA2 is an area extending from the bending area BA, and the pad area PA is an area extending from the second non-active area NA2, and a plurality of pads can be disposed in the pad area PA.

A driver IC can be bonded to the plurality of pads. The driver IC can be bonded to the plurality of pads in a chip on plastic (COP) method. For example, the driver IC can be bonded to the plurality of pads by an anisotropic conductive film or the like. Accordingly, the driver IC can be electrically connected to the plurality of pads and transmit an electrical signal to the active area A/A.

Figure 2:
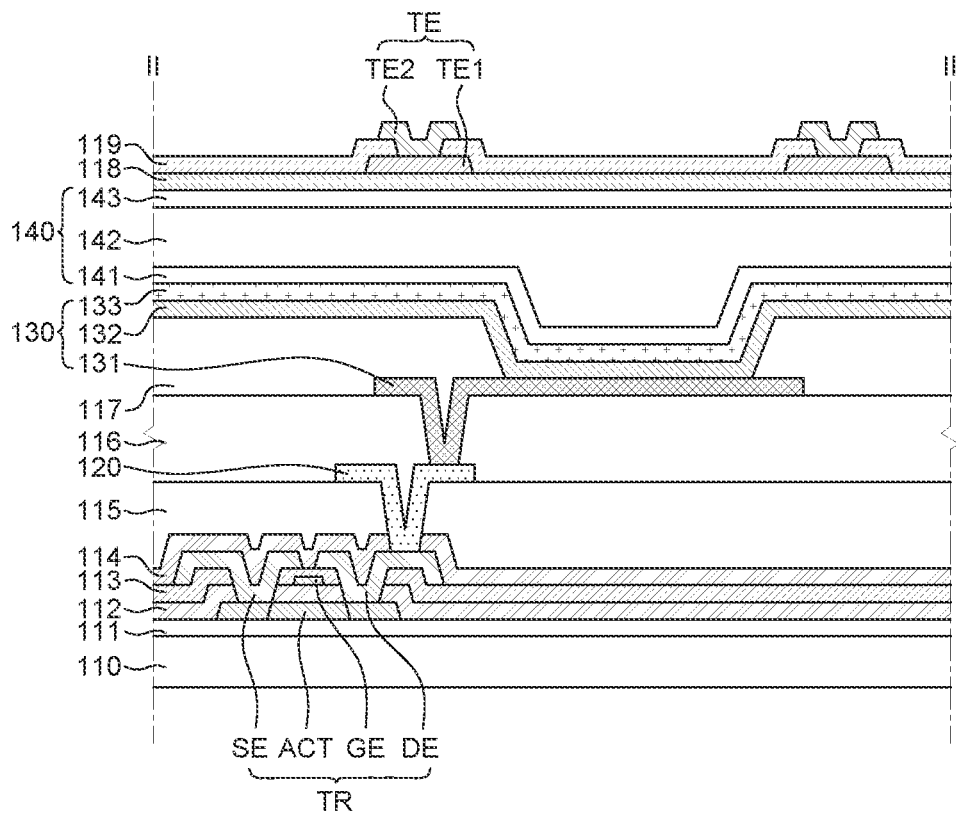
FIG. 2 is a cross-sectional view taken along II-II' of FIG. 1 according to an embodiment of the present disclosure.

FIG. 2 is a cross-sectional view taken along II-II' of FIG. 1.

Referring to FIG. 2, the substrate 110, a buffer layer 111, transistors TR, a gate insulating layer 112, an interlayer insulating layer 113, a passivation layer 114, a first planarization layer 115, a second planarization layer 116, a connection electrode 120, a bank 117, a light emitting element 130, an encapsulation unit 140, and touch sensing units TE can be disposed in the active area A/A of the display device 100 according to an example embodiment of the present disclosure.

The buffer layer 111 can be disposed on the substrate 110. The buffer layer 111 can improve adhesion between layers formed on the buffer layer 111 and the substrate 110, and can serve to block alkali components, outgassing and the like, leaking from the substrate 110. In addition, the buffer layer 111 is not an essential component, and can be omitted based on a type and a material of the substrate 110, a structure and a type of the transistor TR, and the like.

The transistor TR can be disposed on the buffer layer 111. The transistor TR can include an active layer ACT, a gate electrode GE, a source electrode SE, and a drain electrode DE. Here, according to a design of a pixel circuit, the source electrode SE can be the drain electrode DE, and the drain electrode DE can be the source electrode SE. In the active area A/A of the substrate 110, the active layer ACT of the transistor TR can be disposed on the buffer layer 111.

The active layer ACT can include a channel region in which a channel is formed when the transistor TR is driven, and a source region and a drain region on both sides of the channel region. The source region refers to a portion of the active layer ACT that is connected to the source electrode SE, and the drain region refers to a portion of the active layer ACT that is connected to the drain electrode DE.

The active layer ACT can be formed of, for example, various metal oxides such as indium-gallium-zinc-oxide (IGZO) and the like. The active layer ACT of the transistor TR is described as being formed on a basis of an IGZO layer, assuming that the active layer ACT of the transistor TR is formed of IGZO among various metal oxides, but the present disclosure is not limited thereto. And, the active layer ACT of the transistor TR can also be formed of other metal oxides such as indium-zinc-oxide (IZO), indium-gallium-tin-oxide (IGTO), indium-gallium-oxide (IGO) or the like. The active layer ACT can be formed by depositing a metal oxide on the buffer layer 111, performing a heat treatment process for stabilization, and then, patterning the metal oxide.

The gate insulating layer 112 can be disposed on the active layer ACT of the transistor TR. The gate insulating layer 112 can be formed of a single layer of silicon nitride (SiNx) or silicon oxide (SiOx) or multiple layers thereof. Contact holes are formed in the gate insulating layer 112 to connect the source electrode SE and the drain electrode DE of the transistor TR to the source region and the drain region of the active layer ACT of the transistor TR, respectively.

The gate electrode GE of the transistor TR can be disposed on the gate insulating layer 112. The gate electrode GE can be formed of a single layer or multiple layers of any one of molybdenum (Mo), copper (Cu), titanium (Ti), aluminum (Al) chromium (Cr), gold (Au), nickel (Ni), and neodymium (Nd) or an alloy of them. The gate electrode GE can be formed on the gate insulating layer 112 to overlap the channel region of the active layer ACT of the transistor TR.

The interlayer insulating layer 113 can be disposed on the gate insulating layer 112 and the gate electrode GE. The interlayer insulating layer 113 can be formed of a single layer of silicon nitride (SiNx) or silicon oxide (SiOx) or multiple layers thereof. Contact holes for exposing the source region and the drain region of the active layer ACT of the transistor TR can be formed in the interlayer insulating layer 113.

The source electrode SE and the drain electrode DE of the transistor TR can be disposed on the interlayer insulating layer 113. The source electrode SE and the drain electrode DE of the transistor TR can be connected to the active layer ACT of the transistor TR through the contact holes formed in the gate insulating layer 112 and the interlayer insulating layer 113. Accordingly, the source electrode SE of the transistor TR can be connected to the source region of the active layer ACT through the contact holes formed in the gate insulating layer 112 and the interlayer insulating layer 113. In addition, the drain electrode DE of the transistor TR can be connected to the drain region of the active layer ACT through the contact holes formed in the gate insulating layer 112 and the interlayer insulating layer 113.

The passivation layer 114 can be disposed on the source electrode SE and the drain electrode DE of the transistor TR. That is, the passivation layer 114 can be disposed to cover a plurality of transistors TR. The passivation layer 114 can be formed of a single layer of silicon nitride (SiNx) or silicon oxide (SiOx) or multiple layers thereof. A contact hole for exposing the drain electrode DE of the transistor TR can be formed in the passivation layer 114.

The first planarization layer 115 can be disposed on the passivation layer 114. A contact hole for exposing the drain electrode DE can be formed in the first planarization layer 115. The first planarization layer 115 can be an organic material layer for planarizing and protecting an upper portion of the transistor TR. For example, the first planarization layer 115 can be formed of an organic material such as an acrylic resin, an epoxy resin, a phenolic resin, a polyamide resin, a polyimide resin, or the like.

The connection electrode 120 can be disposed on the first planarization layer 115. The connection electrode 120 can be connected to the drain electrode DE of the transistor TR through the contact hole of the first planarization layer 115. The connection electrode 120 can serve to electrically connect the transistor TR and the first electrode 131. The connection electrode 120 can be formed of a single layer or multiple layers of any one of molybdenum (Mo), copper (Cu), titanium (Ti), aluminum (Al) chromium (Cr), gold (Au), nickel (Ni), and neodymium (Nd) or an alloy of them. The connection electrode 120 can be formed of the same material as the source electrode SE and the drain electrode DE of the transistor TR.

Meanwhile, an additional signal line can be disposed on the first planarization layer 115. In this situation, the signal line can be formed of the same material in the same process as the connection electrode 120, but is not limited thereto.

The second planarization layer 116 can be disposed on the first planarization layer 115 and the connection electrode 120. A contact hole for exposing the connection electrode 120 can be formed in the second planarization layer 116. The second planarization layer 116 can be an organic material layer for planarizing the upper portion of the transistor TR. For example, the second planarization layer 116 can be formed of an organic material such as an acrylic resin, an epoxy resin, a phenolic resin, a polyamide resin, a polyimide resin, or the like.

The light emitting element 130 can be disposed on the second planarization layer 116. The light emitting element 130 can include a first electrode 131, a light emitting structure 132, and a second electrode 133.

The first electrode 131 can be disposed on the second planarization layer 116. The first electrode 131 can be electrically connected to the connection electrode 120 through the contact hole formed in the second planarization layer 116. Accordingly, the first electrode 131 is connected to the connection electrode 120 through the contact hole formed in the second planarization layer 116 and thus, can be electrically connected to the transistor TR.

Since the display device 100 according to an example embodiment of the present disclosure is a top emission type display device, the first electrode 131 can be an anode electrode. When the display device 100 is a bottom emission type display device, the first electrode 131 disposed on the second planarization layer 116 can be a cathode electrode.

The bank 117 can be disposed on the first electrode 131 and the second planarization layer 116. An opening for exposing the first electrode 131 can be formed in the bank 117. The bank 117 can define an emission area of the display device 100 and thus, can be referred to as a pixel defining layer. A spacer can be further disposed on the bank 117.

The light emitting structure 132 including a light emitting layer can be further disposed on the first electrode 131. The light emitting structure 132 can be formed by stacking a hole layer, the light emitting layer, and an electron layer on the first electrode 131 in an order or in a reverse order. In addition, the light emitting structure 132 can include a first light emitting structure and a second light emitting structure that face each other with a charge generating layer interposed therebetween. In this situation, the light emitting layer of any one of the first and second light emitting structures generates blue light, and the light emitting layer of the other one of the first and second light emitting structures generates yellow-green light, so that white light can be generated through the first and second light emitting structures. White light that is generated from the light emitting structure 132 can be incident on a color filter positioned at an upper portion of the light emitting structure 132 and implement a color image. In addition, a color image can be implemented by generating color light corresponding to each sub-pixel in each light emitting structure 132 without a separate color filter. That is, the light emitting structure 132 of a red sub-pixel can generate red light, the light emitting structure 132 of a green sub-pixel can generate green light, and the light emitting structure 132 of a blue sub-pixel can generate blue light.

The second electrode 133 can be further disposed on the light emitting structure 132. The second electrode 133 can be disposed on the light emitting structure 132 to face the first electrode 131 with the light emitting structure 132 interposed therebetween. In the display device 100 according to an example embodiment of the present disclosure, the second electrode 133 can be a cathode electrode.

The encapsulation unit 140 can be disposed on the light emitting element 130. For example, the encapsulation unit 140 for inhibiting penetration of moisture can be further disposed on the second electrode 133.

The encapsulation unit 140 can include a first inorganic encapsulation layer 141, an organic encapsulation layer 142, and a second inorganic encapsulation layer 143. The first inorganic encapsulation layer 141 of the encapsulation unit 140 can be disposed on the second electrode 133. In addition, the organic encapsulation layer 142 can be disposed on the first inorganic encapsulation layer 141. Also, the second inorganic encapsulation layer 143 can be disposed on the organic encapsulation layer 142. The first inorganic encapsulation layer 141 and the second inorganic encapsulation layer 143 of the encapsulation unit 140 can be formed of an inorganic material such as silicon nitride (SiNx) or silicon oxide (SiOx). The organic encapsulation layer 142 of the encapsulation unit 140 can be formed of an organic material such as an acrylic resin, an epoxy resin, a phenolic resin, a polyamide resin, a polyimide resin, or the like.

A first touch interlayer insulating layer 118 can be disposed on the second inorganic encapsulation layer 143 of the encapsulation unit 140. The first touch interlayer insulating layer 118 can be formed of an inorganic material such as silicon nitride (SiNx) or silicon oxide (SiOx).

A plurality of the touch sensing units TE including a plurality of bridge electrodes TE1 and a plurality of touch electrodes TE2 can be disposed on the first touch interlayer insulating layer 118.

Specifically, the plurality of bridge electrodes TE1 can be disposed on the first touch interlayer insulating layer 118, and a second touch interlayer insulating layer 119 can be disposed on the plurality of bridge electrodes Te1. In addition, the plurality of touch electrodes TE2 can be disposed on the second touch interlayer insulating layer 119. The plurality of touch electrodes TE2 can be in contact with the plurality of bridge electrodes TE1 through holes provided in the second touch interlayer insulating layer 119. The plurality of touch electrodes TE2 can have portions disposed on the plurality of bridge electrodes TE1 and electrically connected to the plurality of bridge electrodes TE1. Meanwhile, the plurality of touch electrodes TE2 can be electrodes formed of a transparent metal or electrodes formed of an opaque metal. The second touch interlayer insulating layer 119 can be formed of an inorganic material such as silicon nitride (SiNx) or silicon oxide (SiOx).

Figure 3:
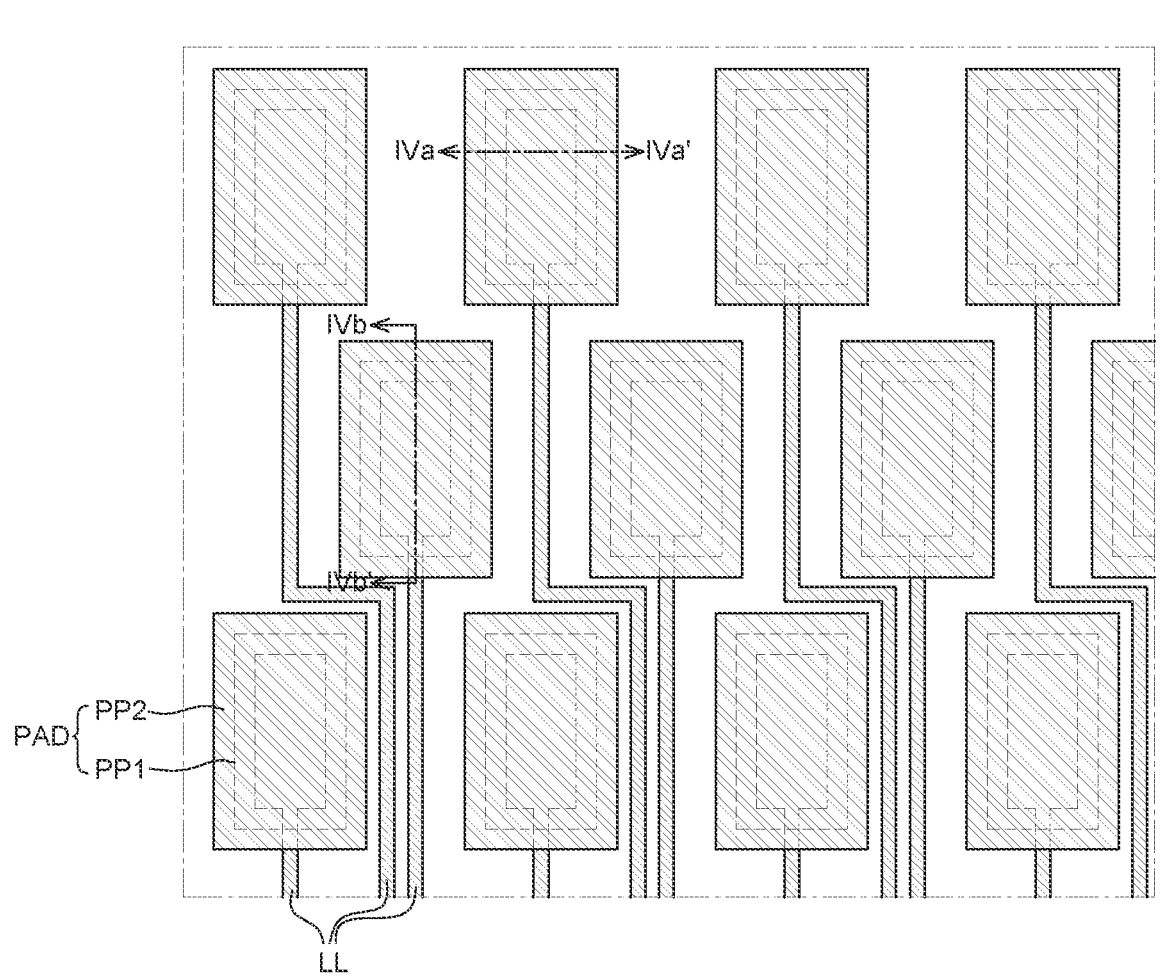
FIG. 3 is an enlarged view of area III of FIG. 1 according to an embodiment of the present disclosure.
Figure 4A:
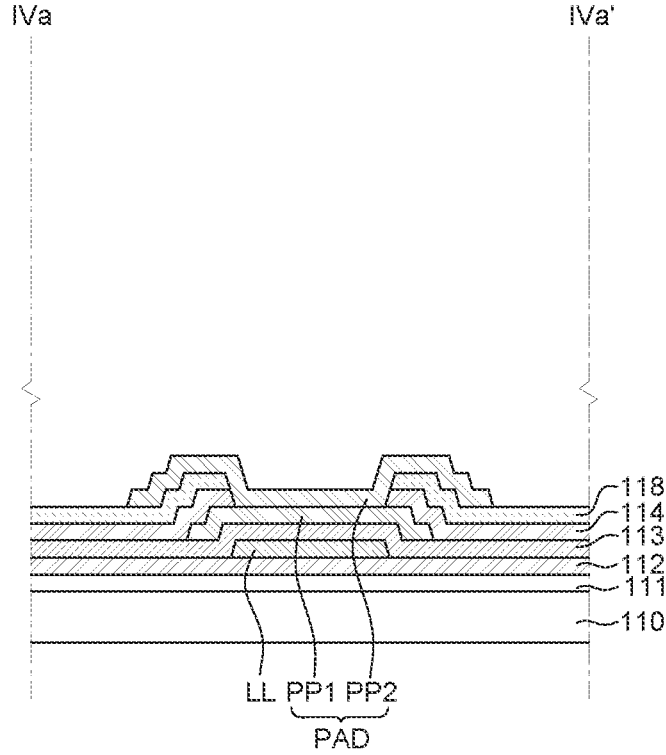
FIG. 4A is a cross-sectional view taken along IVa-IVa' of FIG. 3 according to an embodiment of the present disclosure.
Figure 4B:
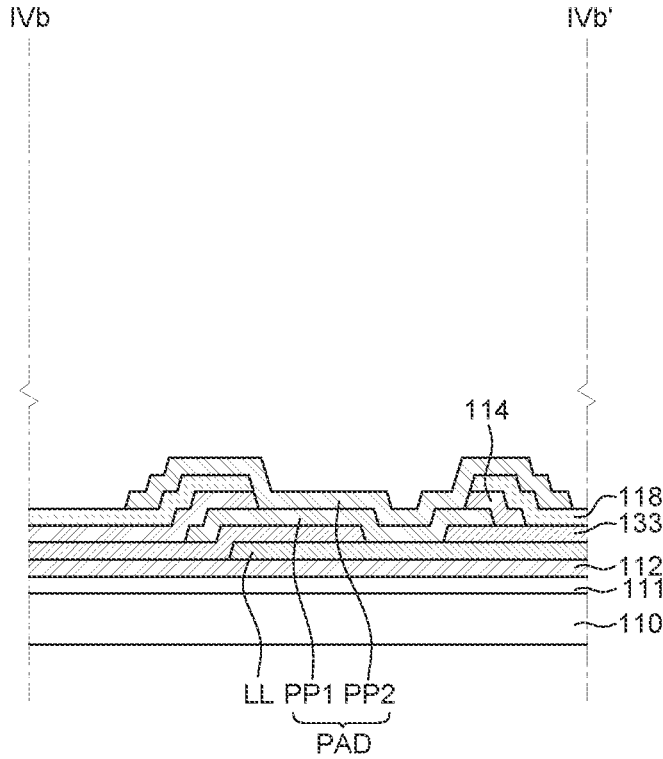
FIG. 4B is a cross-sectional view taken along IVb-IVb' of FIG. 3 according to an embodiment of the present disclosure.

FIG. 3 is an enlarged view of area III of FIG. 1. FIG. 4A is a cross-sectional view taken along IVa-IVa' of FIG. 3. FIG. 4B is a cross-sectional view taken along IVb-IVb' of FIG. 3.

Referring to FIG. 3, a plurality of pads PAD can be disposed on a plurality of link lines LL in the pad area PA. The plurality of pads PAD can be connected to the plurality of link lines LL that are disposed to extend from the active area A/A to the non-active area N/A. The link lines LL can be disposed in the non-active area N/A on the substrate 110. The plurality of pads PAD can include first pad patterns PP1 and second pad patterns PP2. The plurality of pads PAD can be disposed in three rows as illustrated in FIG. 3, but are not limited thereto.

Referring to FIGS. 3 to 4B, the substrate 110, the buffer layer 111, the gate insulating layer 112, the link lines LL, the interlayer insulating layer 113, the first pad patterns PP1, the passivation layer 114, the first touch interlayer insulating interlayer 118, and the second pad patterns PP2 can be disposed in the pad area PA.

In the pad area PA, the buffer layer 111 is disposed on the substrate 110, and the gate insulating layer 112 is disposed on the buffer layer 111. The buffer layer 111 and the gate insulating layer 112 that are disposed in the pad area PA can be formed by the same process as the buffer layer 111 and the gate insulating layer 112 that are formed in the active area A/A.

The plurality of link lines LL are disposed on the gate insulating layer 112. The plurality of link lines LL can be formed of the same material as the gate electrode GE of the active area A/A. That is, the plurality of link lines LL can be formed by the same process as the gate electrode GE. The plurality of link lines LL can extend from the active area A/A to the pad area PA.

The interlayer insulating layer 113 is disposed on the link lines LL. The interlayer insulating layer 113 can be formed by the same process as the interlayer insulating layer 113 formed in the active area A/A. The interlayer insulating layer 113 can be disposed to cover the gate insulating layer 112 and the plurality of link lines LL.

The first pad patterns PP1 are disposed on the interlayer insulating layer 113. The first pad pattern PP1 can be formed of the same material as the source electrode SE and the drain electrode DE of the transistor TR disposed in the active area A/A. That is, the first pad pattern PP1 can be formed by the same process as the source electrode SE and the drain electrode DE. Accordingly, the first pad pattern PP1 can be formed of, for example, a metallic material, such as aluminum (Al) or the like.

Referring to FIG. 4B, a contact hole for exposing the link line LL can be formed in the interlayer insulating layer 113. Accordingly, the first pad pattern PP1 can be connected to the link line LL by the contact hole formed in the interlayer insulating layer 113.

In FIGS. 4A to 4B, the first pad pattern PP1 is illustrated as being formed as a single layer, but a third pad pattern formed of the same material as the connection electrode 120 can be further disposed on the first pad pattern PP1, but the present disclosure is not limited thereto.

The passivation layer 114 is disposed to cover ends of the first pad patterns PP1. For example, the passivation layer 114 can overlap with and cover the outer peripheral edges of each of the first pad patterns PP1. The passivation layer 114 in the pad area can be formed by the same process as the passivation layer 114 formed in the active area A/A. The passivation layer 114 can be disposed on the interlayer insulating layer 113 to cover the ends of the first pad patterns PP1. Accordingly, a partial area or portions of the first pad pattern PP1, for example, a central area of the first pad pattern PP1 can be exposed by the passivation layer 114. Since the passivation layer 114 can overlap with and cover the outer peripheral edges of each of the first pad patterns PP1, the passivation layer 114 can effectively hold down each of the first pad patterns PP1 and seal it in place (e.g., the passivation layer 114 can hold down the edges of each of the first pad patterns PP1 which can prevent peeling).

The first touch interlayer insulating layer 118 is disposed on the passivation layer 114. The first touch interlayer insulating layer 118 can be formed by the same process as the first touch interlayer insulating layer 118 formed in the active area A/A. The first touch interlayer insulating layer 118 can be disposed to cover the passivation layer 114. Accordingly, the first touch interlayer insulating layer 118 can also be disposed to cover the ends of the first pad patterns PP1 in the same manner as the passivation layer 114, and a partial area of the first pad pattern PP1, for example, the central area of the first pad pattern PP1 can be exposed by the first touch interlayer insulating layer 118.

Also, the first touch interlayer insulating layer 118 and the passivation layer 114 can both overlap with and cover the outer peripheral edges of each of the first pad patterns PP1, which can work together to more effectively hold down each of the first pad patterns PP1 and seal them in place. For instance, the first touch interlayer insulating layer 118 and the passivation layer 114 can effectively work together to strongly hold down the edges of each of the first pad patterns PP1 which can prevent peeling.

Also, stepped portions can be formed at along the edges first pad patterns PP1 which can increase the contact area between passivation layer 114 and the edges of the first pad patterns PP1, in order to further improve adhesion. Similarly, stepped portions can also be formed along portions of the passivation layer 114 which can increase the contact area between the passivation layer 114 and the first touch interlayer insulating layer 118 in areas overlapping with the edges of the first pad patterns PP1, in order to further improve adhesion and provide a robust and structurally strong configuration. Thus, this can make it difficult or almost impossible for one of the first pad patterns PP1 to become peeled off or disconnected from a corresponding one of the plurality of link lines LL.

Referring to FIGS. 4A and 4B, an end of the first touch interlayer insulating layer 118 and an end of the passivation layer 114 disposed on the first pad pattern PP1 can be positioned on the same plane. That is, a contact hole formed in the passivation layer 114 and the first touch interlayer insulating layer 118 to expose the first pad pattern PP1 can be a contact hole that is formed by etching the passivation layer 114 and the first touch interlayer insulating layer 118 at the same time.

The second pad pattern PP2 is disposed on the first touch interlayer insulating layer 118 to be in contact with the first pad pattern PP1. The second pad pattern PP2 can be connected to the first pad pattern PP1 through the contact hole formed in the passivation layer 114 and the first touch interlayer insulating layer 118. That is, a portion of the second pad pattern PP2 can be disposed on the passivation layer 114 and the first touch interlayer insulating layer 118, and a remainder portion of the second pad pattern PP2 can be disposed on the first pad pattern PP1 to be in contact with the first pad pattern PP1.

The second pad pattern PP2 can be formed of the same material as the touch electrode TE2 of the touch sensing unit TE of the active area A/A. That is, the second pad pattern PP2 can be formed by the same process as the touch electrode TE2. The second pad pattern PP2 can be formed of, for example, a transparent metal or an opaque metal. However, the present disclosure is not limited thereto, and the second pad pattern PP2 can be formed by the same process as the bridge electrode TE1 of the touch sensing unit TE of the active area A/A.

Hereinafter, FIGS. 5A to 5E are referred together for describing a manufacturing method of the display device 100 according to an example embodiment of the present disclosure, described above.

FIGS. 5A to 5E are views for explaining a manufacturing process of the display device 100 according to an example embodiment of the present disclosure. FIGS. 5A to 5E are process cross-sectional views illustrating a manufacturing method of the display device 100 illustrated in FIGS. 1 to 4B.

Figure 5A:
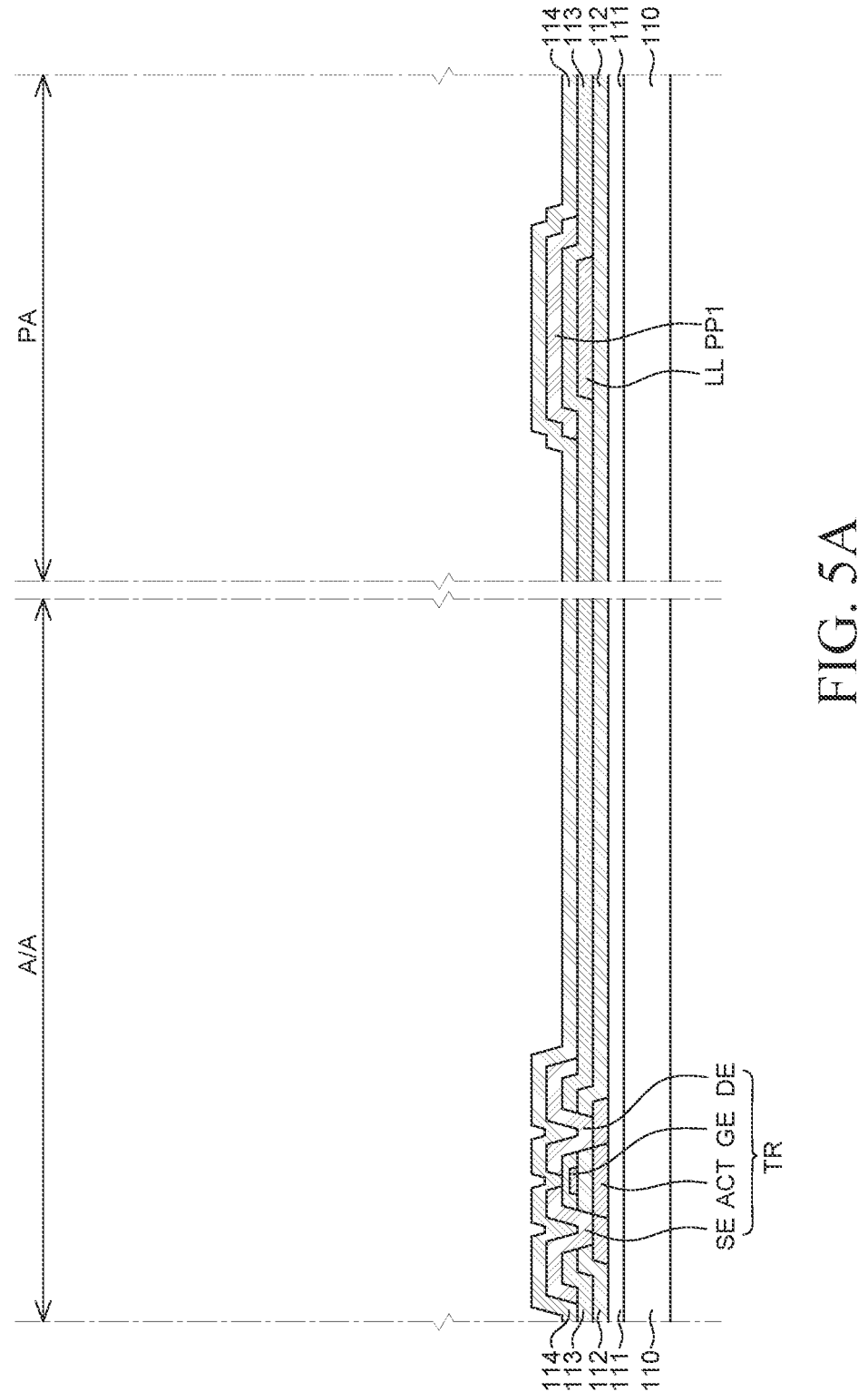
FIGS. 5A to 5E are views for explaining a manufacturing process of a display device according to an example embodiment of the present disclosure.

First, referring to FIG. 5A, the transistor TR is formed in the active area A/A on the substrate 110, and the link line LL and the first pad pattern PP1 are formed in the pad area PA of the non-active area N/A. In this situation, the first pad pattern PP1 can be disposed to overlap the link line LL.

Specifically, in the active area A/A, the buffer layer 111 is formed on the substrate 110, and the active layer ACT is formed on the buffer layer 111. The gate insulating layer 112 for insulating the active layer ACT and the gate electrode GE is formed on the buffer layer 111 and the active layer ACT. The gate electrode GE is formed on the gate insulating layer 112 to overlap the channel region of the active layer ACT, and the interlayer insulating layer 113 is formed on the gate insulating layer 112 and the gate electrode GE. Contact holes are formed in the interlayer insulating layer 113 and the gate insulating layer 112 so that the source electrode SE and the drain electrode DE come in contact with the active layer ACT. In addition, the source electrode SE and the drain electrode DE that are in contact with the active layer ACT through the contact holes are formed.

In the pad area PA of the non-active area N/A, the buffer layer 111 is formed on the substrate 110, and the gate insulating layer 112 is formed on the buffer layer 111. The link line LL formed of the same material as the gate electrode GE are formed on the gate insulating layer 112. The interlayer insulating layer 113 is formed on the gate insulating layer 112 and the link line LL. The first pad pattern PP1 is formed on the interlayer insulating layer 113 to overlap the link line LL. At this time, the first pad pattern PP1 can be in contact with the link line LL by a contact hole formed in the interlayer insulating layer 113 to expose the link line LL, as illustrated in FIG. 4B described above.

The passivation layer 114 is formed on the interlayer insulating layer 113, the source electrode SE and the drain electrode DE of the active area A/A, and the first pad pattern PP1 of the pad area PA. Accordingly, the passivation layer 114 can cover all of the source electrode SE and the drain electrode DE of the active area A/A, and the first pad pattern PP1 of the pad area PA. In this way, the passivation layer 114 can provide protection during various manufacturing processing steps, particularly for protecting the upper surface of the first pad pattern PP1, since the first pad pattern PP1 is completely covered by the passivation layer 114 at this point in the manufacturing process.

Figure 5B:
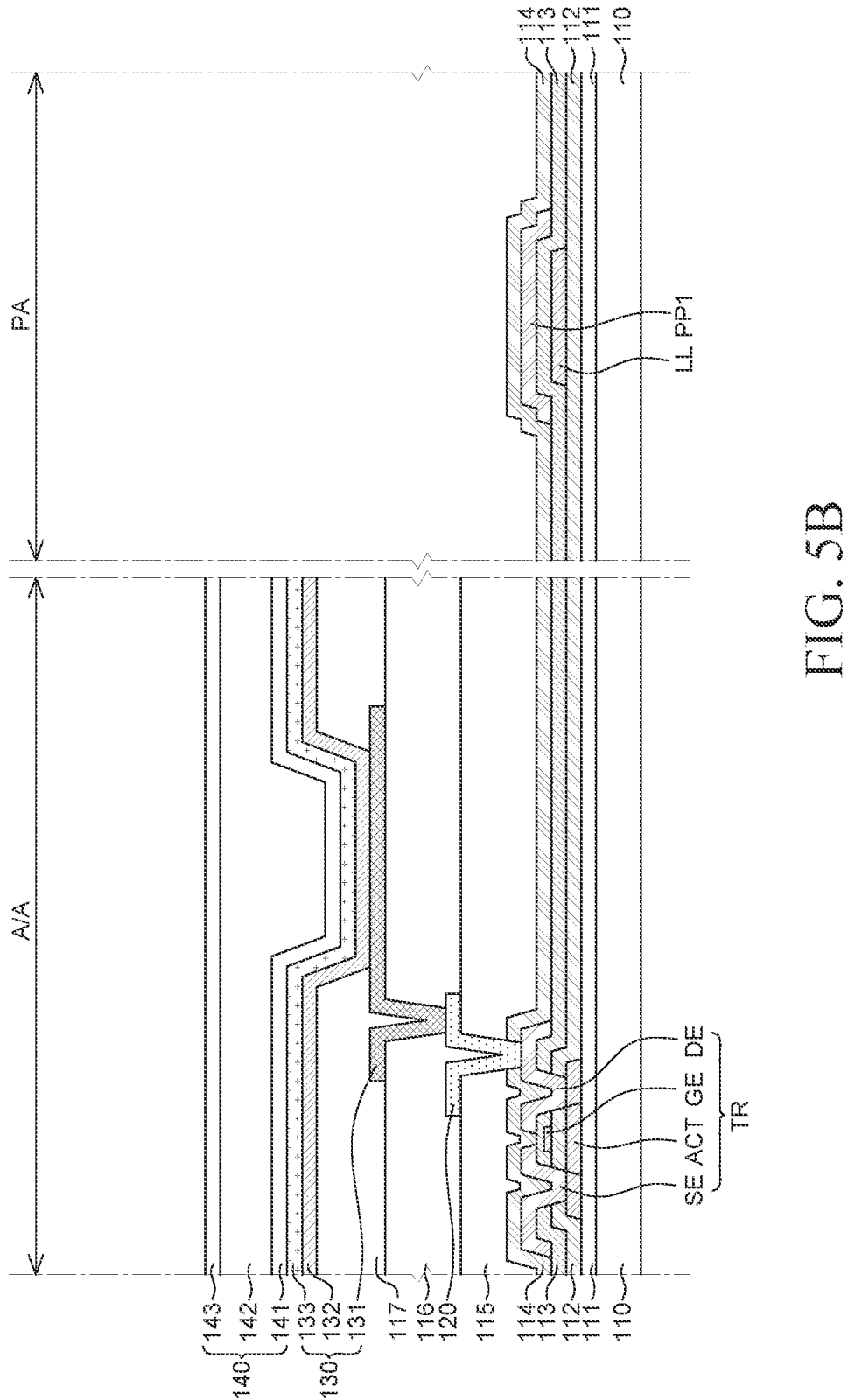

Next, referring to FIG. 5B, the first planarization layer 115 for planarizing the upper portion of the transistor TR is formed on the passivation layer 114 in the active area A/A. The connection electrode 120 is formed on the first planarization layer 115. A contact hole for contacting the connection electrode 120 and the drain electrode DE can be formed in the first planarization layer 115, so that the connection electrode 120 and the drain electrode DE can be in contact with each other. The second planarization layer 116 is disposed on the connection electrode 120.

The light emitting element 130 is disposed on the second planarization layer 116. Specifically, the first electrode 131 is disposed on the second planarization layer 116. A contact hole for contacting the connection electrode 120 and the first electrode 131 can be formed in the second planarization layer 116, so that the connection electrode 120 and the first electrode 131 can be in contact with each other. The bank 117 is formed on the first electrode 131 and the second planarization layer 116 to expose a portion of the first electrode 131. The light emitting structure 132 is disposed on the exposed portion of the first electrode 131 and the bank 117. The second electrode 133 is disposed on the light emitting structure 132.

The encapsulation unit 140 is disposed on the second electrode 133. Specifically, the first inorganic encapsulation layer 141 is disposed on the second electrode 133. The organic encapsulation layer 142 is disposed on the first inorganic encapsulation layer 141. The second inorganic encapsulation layer 143 is disposed on the organic encapsulation layer 142.

As described above, in a process of forming the first planarization layer 115, the connection electrode 120, the second planarization layer 116, and the light emitting element 130 in the active area A/A, the passivation layer 114 is disposed on the first pad pattern PP1. Accordingly, in an etching process used in a manufacturing process of the first planarization layer 115, the connection electrode 120, the second planarization layer 116, and the light emitting element 130, the passivation layer 114 can protect the first pad pattern PP1, since the first pad pattern PP1 is still completely covered by the passivation layer 114 during this point in the manufacturing process.

Figure 5C:
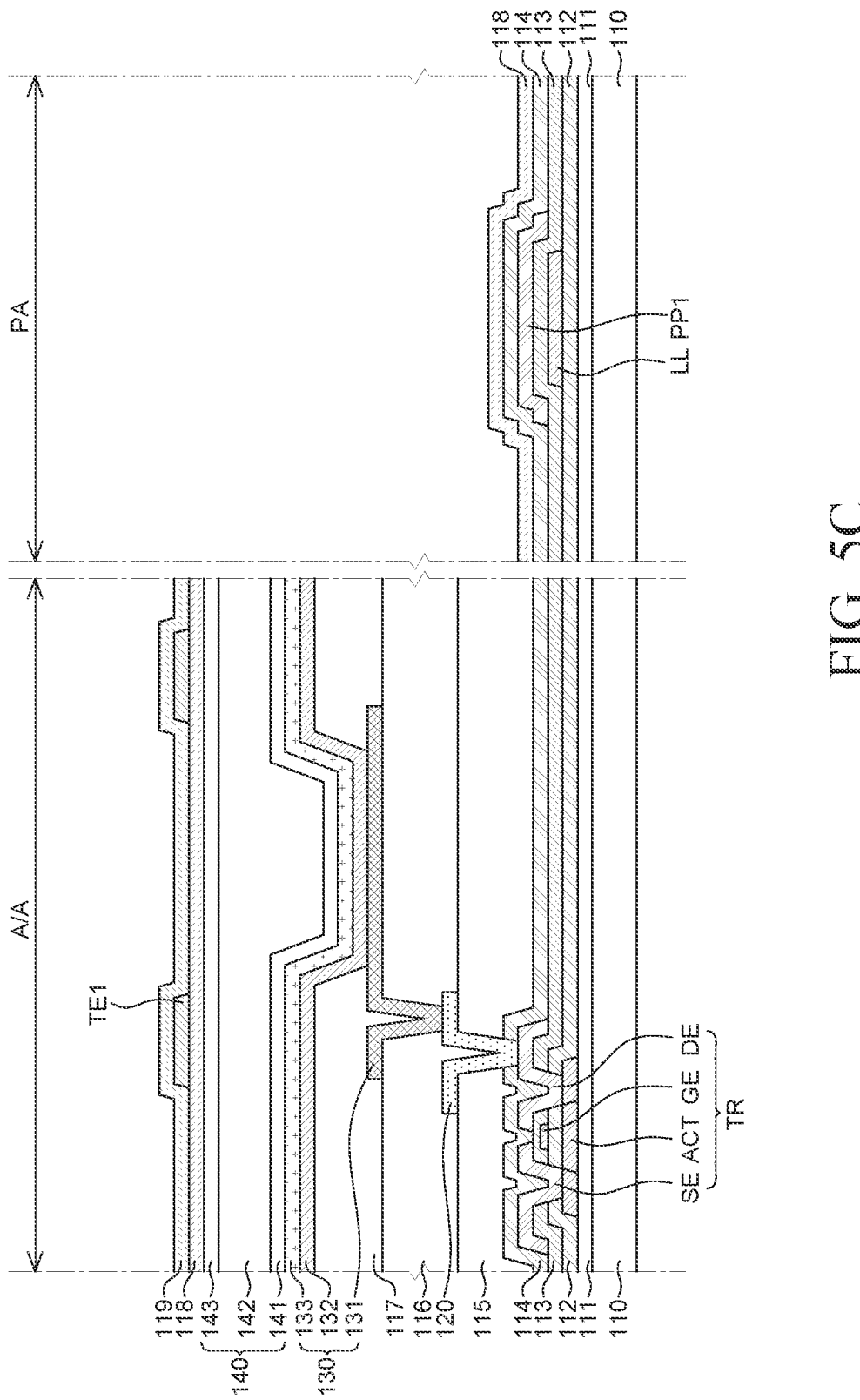

Referring to FIG. 5C, the first touch interlayer insulating layer 118 is disposed on the second inorganic encapsulation layer 143 of the active area A/A and the passivation layer 114 of the pad area PA. In addition, the bridge electrode TE1 is disposed on the first touch interlayer insulating layer 118 in the active area A/A. The second touch interlayer insulating layer 119 is disposed on the first touch interlayer insulating layer 118 and the bridge electrode TE1 of the active area A/A.

Figure 5D:
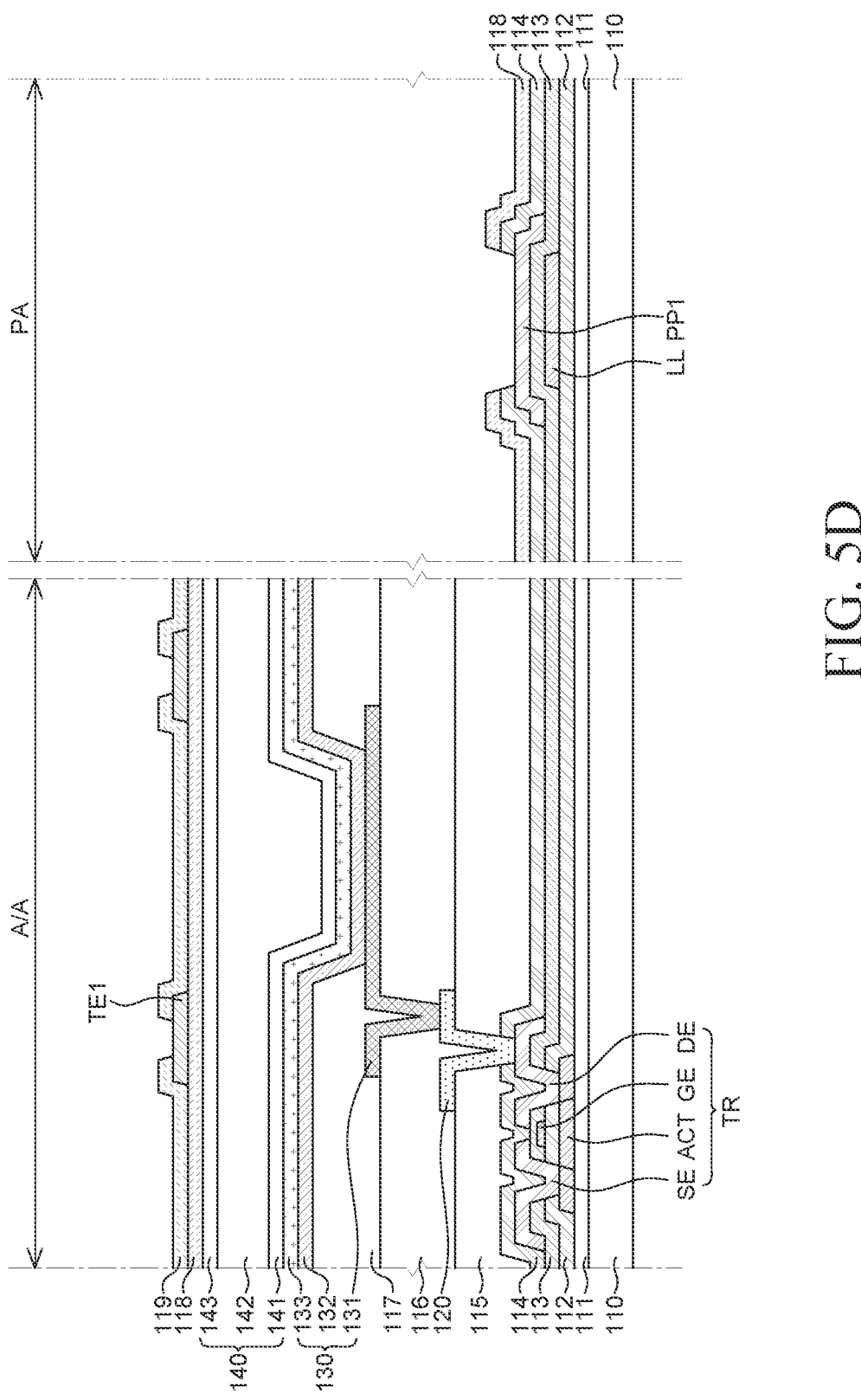

Referring to FIG. 5D, a contact hole that exposes the bridge electrode TE1 is formed in the second touch interlayer insulating layer 119 in the active area A/A. A contact hole that exposes the first pad pattern PP1 is formed in the passivation layer 114 and the first touch interlayer insulating layer 118 in the pad area PA. Thus, the first pad pattern PP1 has been completely covered and protected by the passivation layer 114 during the previous manufacturing steps, until a center of the first pad pattern PP1 is finally exposed once the contact hole has been formed in the passivation layer 114. In this situation, the contact hole that exposes the bridge electrode TE1 of the active area A/A and the contact hole that exposes the first pad pattern PP1 of the pad area PA can be formed by the same process.

Figure 5E:
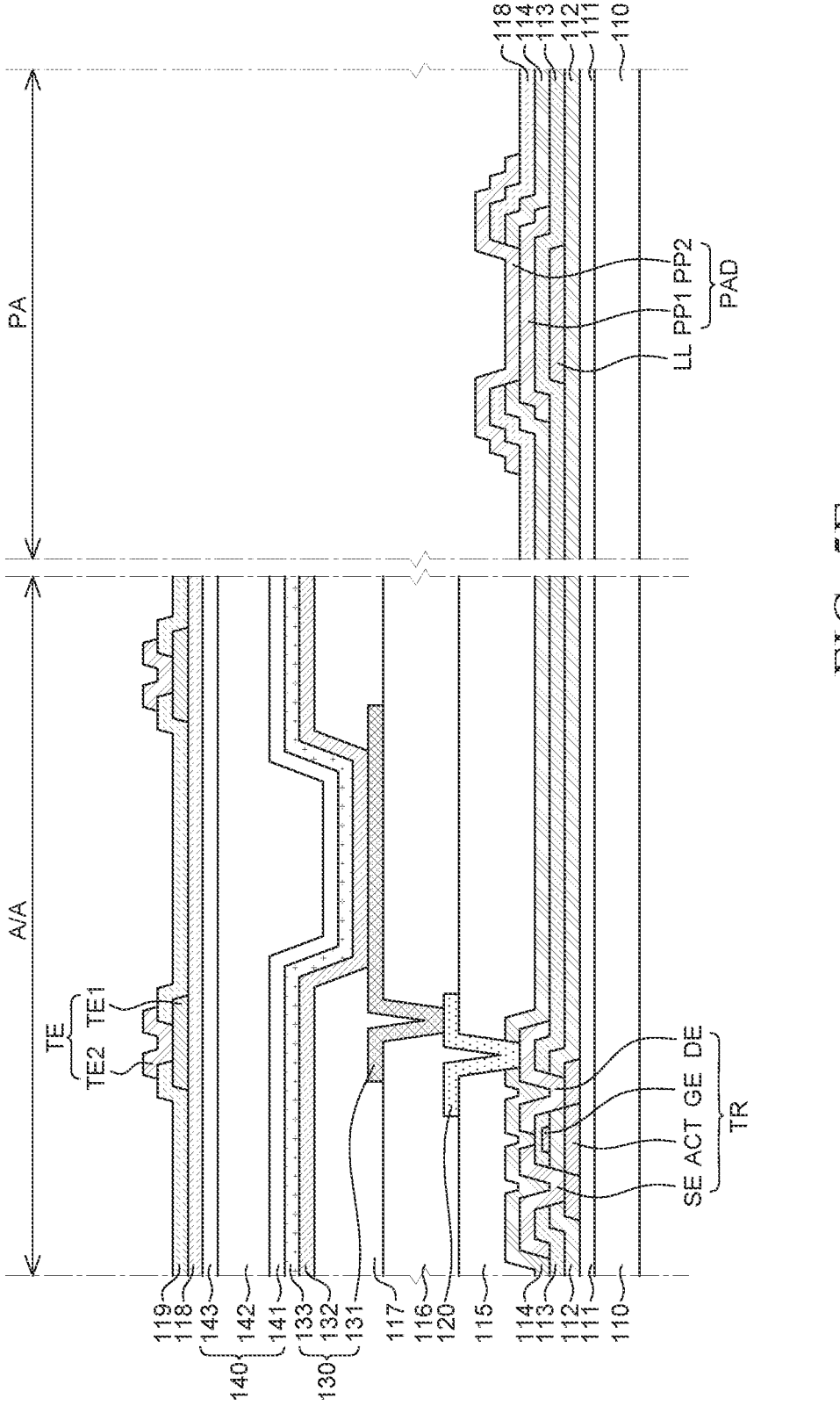

Referring to FIG. 5E, the touch electrode TE2 is formed on the bridge electrode TE1 and the second touch interlayer insulating layer 119 to overlap the bridge electrode TE1 in the active area A/A. The second pad pattern PP2 is formed on the first pad pattern PP1 and the first touch interlayer insulating layer 118 to overlap the first pad pattern PP1 in the pad area PA. Accordingly, the pad PAD including the first pad pattern PP1 and the second pad pattern PP2 can be formed in the pad area PA.

In the display device 100 according to an example embodiment of the present disclosure, in contrast to existing display devices, the passivation layer 114 is used to cover the ends and outer edges of the first pad patterns PP1 in the pad area PA, so that it is possible to minimize an interface delamination phenomenon caused by the planarization layer.

Also, existing display devices use a planarization layer formed of an organic material, such as acrylic resin, epoxy resin, phenolic resin, polyamide resin, polyimide resin or the like, and there is a defect in which a film delamination phenomenon at an interface of the planarization layer formed of the organic material of the display device occurs in high-temperature and high-humidity environments. Accordingly, as the planarization layer in which the film delamination phenomenon has occurred and second pad patterns disposed on the planarization layer are lifted up or become peeled off, there occurs a defect in which connection between the pads and a flexible printed circuit board or chip on film (COF) is broken. When such a defect occurs, the display device may not be driven or a line defect in which some lines are recognized as black lines can occur (e.g., a row or column of dead pixels).

Therefore, in the display device 100 according to an example embodiment of the present disclosure, instead of using a planarization layer formed of an organic material, the passivation layer 114 is formed of an inorganic material that is stable even in high-temperature and high-humidity environments is configured to cover the ends and all outer edges of the first pad patterns PP1 in the pad area PA. Accordingly, in the display device 100 according to an example embodiment of the present disclosure, an interface delamination phenomenon of the pad area PA can be minimized even in high-temperature and high-humidity environments, and a driving defect or line defect of the display device 100 can be prevented. For instance, the outer periphery of each of the first pad patterns PP1 can be more strongly held down and adhered in place, making it difficult or nearly impossible to be peeled away from a corresponding link line and moisture penetration can be more effectively prevented since the edges of each of the first pad patterns PP1 are sealed by the passivation layer 114.

In addition, in the display device 100 according to an example embodiment of the present disclosure, the passivation layer 114 is formed on the first pad pattern PP1 to protect the first pad pattern PP1 so that the first pad pattern PP1 does not come into contact with a material that can cause a residue during other manufacturing processes of the display device 100.

In the display device of a comparative example, the planarization layer that is disposed on the first pad pattern is etched away to form a contact hole so that the first pad pattern and the second pad pattern can contact each other. In this situation, a process of forming the contact hole by etching the planarization layer disposed on the first pad pattern is performed simultaneously with a process of forming a contact hole in the planarization layer in the active area. Accordingly, in a subsequent manufacturing process of the display device, other structures are deposited or etched on the first pad pattern that is exposed through the contact hole of the planarization layer, and consequently, an undesirable residue may be generated in the first pad pattern. Thus, there are defects in which dark spots are caused in the display device by the residue (e.g., the residue may impair the connection or adhesion between a first pad pattern and a corresponding link line).

For example, after forming the contact hole in the planarization layer, a process of forming an anode of a light emitting element is performed. In this situation, after forming the anode in the form of a single layer in the display device, the anode can be formed in the active area through an etching process. At this time, when the first pad pattern is formed of aluminum (Al) and the anode is formed of silver (Ag), Galvanic effects of aluminum (Al) and silver (Ag) by an etchant used in the etching process for the anode may occur. Accordingly, a silver (Ag) residue may be precipitated on the first pad pattern, and the first pad pattern and the cathode may be connected by the silver (Ag) residue generated on the first pad pattern. When the first pad pattern and the cathode are connected as described above, a dark spot defect may occur in the display device.

Accordingly, in the display device 100 according to an example embodiment of the present disclosure, the passivation layer 114 is disposed on the first pad patterns PP1, and contact holes for contacting the first pad patterns PP1 and the second pad patterns PP2 are formed through a process of etching the first touch interlayer insulating layer 118 of the active area A/A and the passivation layer 114 of the pad area PA simultaneously, so that it is possible to protect the first pad patterns PP1 so as not to be in contact with a material that can cause a residue during the manufacturing process of the display device 100. That is, in the display device 100 according to the example embodiment of the present disclosure, in a process of forming the first planarization layer 115, the connection electrode 120, the second planarization layer 116, and the light emitting element 130 in the active area A/A, the passivation layer 114 remains disposed on the first pad patterns PP1 all the time and completely covers the first pad patterns PP1 during various manufacturing process steps, so that it is possible to protect the first pad patterns PP1 so as not to be in contact with a material that can cause a residue or adhesion impairment, and occurrence of a dark spot defect in the display device 100 can be minimized or prevented.

The example embodiments of the present disclosure can also be described as follows:

According to an aspect of the present invention, a display device according to an example embodiment of the present disclosure includes a substrate including an active area in which a plurality of pixels are disposed, and a non-active area extending from the active area and including a pad area; a plurality of transistors disposed in the plurality of pixels on the substrate; a passivation layer disposed to cover the plurality of transistors; a plurality of pads disposed in the pad area; a plurality of link lines disposed in the non-active area and connected to the plurality of pads; and a driver IC bonded to the plurality of pads, in which the plurality of pads can include first pad patterns formed of the same material as source electrodes and drain electrodes of the plurality of transistors, in which the passivation layer can be disposed to cover ends of the first pad patterns.

The display device can further comprise an encapsulation unit disposed on the plurality of pixels; a touch interlayer insulating layer disposed on the encapsulation unit; and a touch sensing unit disposed on the touch interlayer insulating layer.

The touch interlayer insulating layer can be disposed on the passivation layer to cover the ends of the first pad patterns.

The plurality of pads can further include second pad patterns that are in contact with the first pad patterns exposed by the passivation layer and the touch interlayer insulating layer and that have portions disposed on the passivation layer and the touch interlayer insulating layers, The second pad patterns can be formed of the same material as a touch electrode of the touch sensing unit.

An end of the touch interlayer insulating layer and an end of the passivation layer disposed on the first pad pattern can be positioned on the same plane.

The first pad patterns can be formed of aluminum (Al).

The substrate can be formed of a plastic material.

The driver IC can be bonded to the plurality of pads in a chip on plastic (COP) method.

The display device can further comprise an interlayer insulating layer disposed between the plurality of pads and the plurality of link lines.

The plurality of link lines can be formed of the same material as gate electrodes of the plurality of transistors.

The plurality of pads can be electrically connected to the plurality of link lines in contact holes of the interlayer insulating layer.

A display device according to another example embodiment of the present disclosure includes a substrate including an active area in which a plurality of pixels are disposed and a non-active area in which a pad area is disposed; a plurality of link lines disposed in the non-active area on the substrate; a plurality of pads including first pad patterns connected to the link lines and disposed in the pad area; a plurality of transistors disposed in each of the plurality of pixels on the substrate; a passivation layer disposed on the plurality of transistors and the first pad patterns; a light emitting element disposed on the passivation layer; and a driver IC bonded to the plurality of pads in a chip on plastic (COP) method in the pad area, in which the passivation layer has contact holes formed therein, the contact holes exposing portions of the first pad patterns.

The display device can further comprise an encapsulation unit disposed on the light emitting element; a touch interlayer insulating layer disposed on the encapsulation unit; and a touch sensing unit disposed on the touch interlayer insulating layer.

The touch interlayer insulating layer can be disposed on the passivation layer in the pad area, and have contact holes formed therein, the contact holes of the touch interlayer insulating layer overlapping the contact holes of the passivation layer exposing the portions of the first pad patterns.

The contact holes of the touch interlayer insulating layer and the contact holes of the passivation layer, exposing the portions of the first pad patterns, can be contact holes formed by the same process.

The touch sensing unit can include a plurality of bridge electrodes disposed on the touch interlayer insulating layer, and a plurality of touch electrodes that have portions disposed on the plurality of bridge electrodes and electrically connected to the plurality of bridge electrodes.

The plurality of pads can further include second pad patterns that are formed of the same material as the touch electrodes and disposed on the touch interlayer insulating layer to overlap the first pad patterns.

The second pad patterns can be disposed on the portions of the first pad patterns exposed by the contact holes formed in the passivation layer and the touch interlayer insulating layer and are electrically connected to the first pad patterns.

Each of the transistors can include an active layer, a source electrode, a gate electrode, and a drain electrode.

The link lines can be formed of the same material as the gate electrode.

The display device can further comprise an interlayer insulating layer disposed between the first pad patterns and the link lines.

The first pad patterns can be electrically connected to the link lines through contact holes formed in the interlayer insulating layer.

Although the example embodiments of the present disclosure have been described in detail with reference to the accompanying drawings, the present disclosure is not limited thereto and can be embodied in many different forms without departing from the technical concept of the present disclosure. Therefore, the example embodiments of the present disclosure are provided for illustrative purposes only but not intended to limit the technical concept of the present disclosure. The scope of the technical concept of the present disclosure is not limited thereto. Therefore, it should be understood that the above-described example embodiments are illustrative in all aspects and do not limit the present disclosure. The protective scope of the present disclosure should be construed based on the following claims, and all the technical concepts in the equivalent scope thereof should be construed as falling within the scope of the present disclosure.

16

What is claimed is:

1. A display device, comprising:
a substrate including an active area in which a plurality of pixels are disposed, and a non-active area extending from the active area and including a pad area;
an encapsulation unit disposed on the plurality of pixels;
a touch interlayer insulating layer disposed on the encapsulation unit; and
a touch sensing unit disposed on the touch interlayer insulating layer,
a plurality of pads disposed in the pad area;
a plurality of link lines disposed in the non-active area and connected to the plurality of pads;
a driver integrated circuit (IC) bonded to the plurality of pads; and
a passivation layer disposed on portions of the plurality of pads disposed in the pad area,
wherein outer edges of each of the plurality of pads are covered by the passivation layer,
wherein the plurality of pads include first pad patterns,
wherein the touch interlayer insulating layer is disposed on the passivation layer, and the touch interlayer insulating layer overlaps with outer edges of each of the first pad patterns, and
wherein the plurality of pads further include second pad patterns that are in contact with portions of the first pad patterns exposed by the passivation layer and the touch interlayer insulating layer, and portions of the second pad patterns are disposed on the passivation layer and the touch interlayer insulating layer.

2. The display device of claim 1, wherein the substrate is a flexible substrate.

3. The display device of claim 1, further comprising:
a plurality of transistors disposed in the plurality of pixels on the substrate,
wherein the first pad patterns are formed of a same material as source electrodes and drain electrodes of the plurality of transistors.

4. The display device of claim 3, further comprising:
an interlayer insulating layer disposed between the plurality of pads and the plurality of link lines,
wherein the plurality of link lines are formed of a same material as gate electrodes of the plurality of transistors, and
wherein the plurality of pads are electrically connected to the plurality of link lines via contact holes in the interlayer insulating layer.

5. The display device of claim 4, wherein each of the first pad patterns is disposed on the interlayer insulating layer to overlap with a corresponding link line among the plurality of link lines.

6. The display device of claim 1,
wherein the second pad patterns are formed of a same material as a touch electrode of the touch sensing unit.

7. The display device of claim 1, wherein an end of the touch interlayer insulating layer and an end of the passivation layer disposed on one of the first pad patterns are positioned on a same plane.

8. The display device of claim 1, wherein the first pad patterns are formed of aluminum (Al).

9. The display device of claim 1, wherein the substrate is formed of a plastic material, and
wherein the driver IC is bonded to the plurality of pads in a chip on plastic (COP) method.

10. The display device of claim 1, wherein the passivation layer is formed of an inorganic material.

11. A display device, comprising:

a substrate including an active area in which a plurality of pixels are disposed and a non-active area in which a pad area is disposed;

an encapsulation unit disposed on the plurality of pixels;

a touch interlayer insulating layer disposed on the encapsulation unit;

a touch sensing unit disposed on the touch interlayer insulating layer;

a plurality of link lines disposed in the non-active area on the substrate;

a plurality of pads including first pad patterns connected to the link lines and disposed in the pad area;

a plurality of transistors disposed in each of the plurality of pixels on the substrate;

a passivation layer disposed on the plurality of transistors and the first pad patterns;

a light emitting element disposed on the passivation layer; and a driver integration circuit (IC) bonded to the plurality of pads, wherein the passivation layer includes contact holes exposing portions of the first pad patterns, wherein the touch interlayer insulating layer is disposed on the passivation layer in the pad area, and the touch interlayer insulating layer includes contact holes in the pad area, and wherein the contact holes in the touch interlayer insulating layer respectively overlap with the contact holes in the passivation layer for exposing the portions of the first pad patterns.

12. The display device of claim 11, wherein the contact holes in the touch interlayer insulating layer and the contact holes in the passivation layer are formed by a same process.

13. The display device of claim 11, wherein the touch sensing unit includes:

a plurality of bridge electrodes disposed on the touch interlayer insulating layer, and a plurality of touch electrodes disposed on the plurality of bridge electrodes and electrically connected to the plurality of bridge electrodes, wherein the plurality of pads further include second pad patterns formed of a same material as the plurality of touch electrodes, and the second pad patterns are disposed on the touch interlayer insulating layer to overlap with the first pad patterns, and wherein the second pad patterns are disposed on the portions of the first pad patterns exposed by the contact holes in the passivation layer and the contact holes in the touch interlayer insulating layer, and the second pad patterns are electrically connected to the first pad patterns, respectively.

14. The display device of claim 11, wherein an end of the touch interlayer insulating layer and an end of the passivation layer disposed on one of the first pad patterns are positioned on a same plane.

15. The display device of claim 11, wherein each of the plurality of transistors includes an active layer, a source electrode, a gate electrode, and a drain electrode, and wherein the plurality of link lines are formed of a same material as the gate electrode.

16. The display device of claim 11, further comprising:

an interlayer insulating layer disposed between the first pad patterns and the plurality of link lines, wherein the first pad patterns are electrically connected to the plurality of link lines through contact holes formed in the interlayer insulating layer, respectively.

17. The display device of claim 16, wherein the first pad patterns are disposed on the interlayer insulating layer to respectively overlap the plurality of link lines.

18. The display device of claim 11, wherein the passivation layer is formed of an inorganic material.

* * * * *